US009276606B2

(12) United States Patent
Vafin et al.

(10) Patent No.: US 9,276,606 B2
(45) Date of Patent: Mar. 1, 2016

(54) CORRECTION DATA

(71) Applicant: Microsoft Technology Licensing, LLC, Redmond, WA (US)

(72) Inventors: Renat Vafin, Tallinn (EE); Soren Vang Andersen, Esch-sur-Alzette (LU); Mattias Nilsson, Sundbyberg (SE)

(73) Assignee: Microsoft Technology Licensing, LLC, Redmond, WA (US)

( * ) Notice: Subject to any disclaimer, the term of this patent is extended or adjusted under 35 U.S.C. 154(b) by 197 days.

(21) Appl. No.: 13/666,774

(22) Filed: Nov. 1, 2012

(65) Prior Publication Data
US 2013/0339824 A1 Dec. 19, 2013

(30) Foreign Application Priority Data
Jun. 18, 2012 (GB) .................................. 1210779.3

(51) Int. Cl.
*H03M 13/00* (2006.01)
*H03M 13/05* (2006.01)
*H03M 13/27* (2006.01)
*H03M 13/11* (2006.01)
*H04L 1/00* (2006.01)

(52) U.S. Cl.
CPC ............. *H03M 13/05* (2013.01); *H04L 1/0055* (2013.01); *H03M 13/11* (2013.01); *H03M 13/27* (2013.01); *H04L 1/0041* (2013.01); *H04L 1/0057* (2013.01)

(58) Field of Classification Search
CPC ... H03M 13/11; H03M 13/27; H03M 13/373; H04L 1/0057; H04L 1/0041; H04L 49/557; H04L 2012/6467; G06F 3/121; G06F 9/3861; G06F 11/1402; G11B 20/1833

USPC .......................................... 714/752, 758, 776
See application file for complete search history.

(56) References Cited

U.S. PATENT DOCUMENTS

| 5,870,412 | A | 2/1999 | Schuster et al. | |
|---|---|---|---|---|
| 6,418,549 | B1 * | 7/2002 | Ramchandran et al. | 714/811 |
| 6,760,742 | B1 * | 7/2004 | Hoyle | 708/492 |
| 7,889,654 | B2 | 2/2011 | Ramakrishnan et al. | |
| 7,940,777 | B2 | 5/2011 | Asati et al. | |
| 7,957,423 | B2 * | 6/2011 | Crookes et al. | 370/474 |

(Continued)

OTHER PUBLICATIONS

"International Search Report and Written Opinion", Application No. PCT/US2013/045748, (Aug. 26, 2013), 9 pages.

(Continued)

*Primary Examiner* — Albert Decady
*Assistant Examiner* — Osman Alshack
(74) *Attorney, Agent, or Firm* — Danielle Johnson-Holmes; Micky Minhas; Wolfe-SBMC

(57) ABSTRACT

Various embodiments provide a method for processing encoded data bits transmitted over a lossy communication channel. In some embodiments, the method receives the encoded data bits over the communication channel, the encoded data bits including redundant data units; decodes the encoded data bits at an error correction decoder, wherein the recovery of lost data is implemented at the error correction decoder using at least one of the redundant data units; determining if at least one data bit is unable to be recovered due to the decoder finding a plurality of candidate bit values for the at least one data bit; receives information relating to the transmitter; analyzing the plurality of candidate bit values to exclude at least one of the candidate bit values for the at least one data bit using information relating to the transmitter; and resolves the at least one data bit based on the analysis.

20 Claims, 7 Drawing Sheets

(56) References Cited

U.S. PATENT DOCUMENTS

| | | | | |
|---|---|---|---|---|
| 2002/0116715 | A1* | 8/2002 | Apostolopoulos | 725/86 |
| 2003/0219118 | A1* | 11/2003 | Beverly | 380/28 |
| 2004/0157627 | A1* | 8/2004 | Bae | 455/466 |
| 2005/0097244 | A1* | 5/2005 | Hayasaka | 710/52 |
| 2005/0226239 | A1* | 10/2005 | Nishida et al. | 370/389 |
| 2006/0280205 | A1* | 12/2006 | Cho | 370/473 |
| 2007/0086335 | A1* | 4/2007 | McCanne et al. | 370/229 |
| 2007/0165673 | A1* | 7/2007 | Huang | 370/474 |
| 2008/0225735 | A1 | 9/2008 | Qiu et al. | |
| 2009/0175389 | A1 | 7/2009 | Huang et al. | |
| 2009/0316823 | A1 | 12/2009 | Lee et al. | |
| 2010/0146352 | A1* | 6/2010 | Suneya | 714/748 |
| 2011/0087952 | A1* | 4/2011 | Marin et al. | 714/792 |
| 2012/0147140 | A1* | 6/2012 | Itakura et al. | 348/43 |
| 2012/0151261 | A1* | 6/2012 | Suneya | 714/18 |
| 2012/0151291 | A1* | 6/2012 | Sugimoto | 714/746 |

OTHER PUBLICATIONS

"Technical Overview of Networking and Communications", Retrieved at <<http://download.microsoft.com/download/e/a/c/eac0309f-2140-4ba6-9817-0bc9e63d13ac/NetworkingOver.doc>>, Mar. 2003, pp. 68.

Tian, et al., "Improved H.264/AVC video broadcast/multicast", Retrieved at <<http://citeseerx.ist.psu.edu/viewdoc/download?doi=10.1.1.160.7423&rep=rep1&type=pdf>>, SPIE, 2005, pp. 1-12.

Adrat, M et al., "Convergence Behavior of Iterative Source-Channel Decoding", (2003), pp. 269-272.

Adrat, M et al., "Efficient Near-Optimum Softbit Source Decoding for Sources with Inter- and Intra-Frame Redundancy", *Proceedings. (ICASSP '04). IEEE International Conference on Acoustics, Speech, and Signal Processing.*, (2004), pp. 653-656.

Adrat, M et al., "Iterative Source-Channel Decoder Using Extrinsic Information from Softbit-Source Decoding", *Proceedings. (ICASSP '01). 2001 IEEE International Conference on Acoustics, Speech, and Signal Processing*, (2001), 4 pages.

Adrat, M et al., "On Joint Source-Channel Decoding for Correlated Sources", (2002), pp. 2505-2508.

Clevorn, Thorsten et al., "Iterative Source-Channel Decoding Using Short Block Codes", *ICASSP 2006 2006 IEEE International Conference on Acoustics, Speech and Signal Processing.*, (2006), pp. 221-224.

Fingscheidt, T et al., "Robust Speech Decoding: A Universal Approach to Bit Error Concealment", *Fingscheidt: 97, ICASSP*, Munich, Germany, vol. 3, (1997), pp. 1667-1670.

\* cited by examiner

CORRECTION DATA

RELATED APPLICATION

This application claims priority under 35 USC 119 or 365 to Great Britain Application No. 1210779.3 filed 18 Jun. 2012, the disclosure of which is incorporated in its entirety.

BACKGROUND

There are many situations in which a data stream is transmitted from a transmitter to a receiver over a communication channel. A communication channel may exist in one (or more) of many different possible networks. For example, a communication channel may exist in the internet or in a wireless network such as a mobile telecommunications network. The data in a data stream may be divided into data packets for transmission over a communication channel. The protocol for dividing the data into data packets (e.g. the form of the headers of the data packets, and other such implementation details) may depend upon the nature of the communication channel on which the data is to be transmitted, e.g. the type of network through which the data packet is to be transmitted. The data may be encoded by an encoder prior to transmission from the transmitter and decoded by a decoder after reception at the receiver.

In an ideal system, the communication channel is lossless such that every data packet transmitted from the transmitter over the communication channel is received at the receiver. However, in real physical systems, the communication channel may be lossy, meaning that some of the transmitted data packets will be lost on the communication channel and as such will not be received at the receiver. This may be detrimental. Correction schemes can be used at the receiver to help recover at least some of the lost data packets.

As an example, forward error correction (FEC) is one correction scheme which can be used to combat packet loss in a communication channel.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments of the invention provide a method for processing encoded data bits at a receiver, wherein the encoded data bits transmitted from a transmitter to the receiver over a lossy communication channel established over a network. The encoded data bits which are received over the communication channel include redundant data units. At an error correction decoder, the encoded data bits are decoded, wherein the recovery of lost data is implemented at the error correction decoder using at least one of the redundant data units. The method comprises a step of determining if at least one data bit is unable to be recovered due to the decoder finding a plurality of candidate bit values for the at least one data bit and receiving information relating to said transmitter. The plurality of candidate bit values are analyzed to exclude at least one of the candidate bit values for the at least one data bit using the information relating to said transmitter and the at least one data bit is resolved based on the analysis.

BRIEF DESCRIPTION OF THE DRAWINGS

For a better understanding of the various embodiments and to show how the same may be put into effect, reference will now be made, by way of example, to the following drawings in which.

DETAILED DESCRIPTION

While FEC reduces loss as seen by an application (e.g. audio or video) decoder compared to the loss in the communication channel, it does not guarantee recovery of all lost original packets.

The extent of data transfer over public networks such as the internet is rapidly increasing. Error correction mechanisms are therefore becoming more important to ensure reliable data transmission.

During FEC decoding uncertainties may arise as to the correct bit value or bit sequence value of a lost packet due to the FEC decoder determining that a plurality of candidate options exist for a particular bit value or bit sequence value.

The inventors have realised that by evaluating the content of candidate packets some uncertainties of the recovery process (i.e. where a bit or sequence of bits could take more than one value) can be resolved to further reduce the packet loss seen by an application decoder, compared to the packet loss in the communication channel.

FEC produces redundant correction data (as FEC data units) in addition to the original data units and includes the FEC data units in the data stream which is transmitted over the communication channel. A FEC scheme that transmits original and redundant FEC data is called a systematic FEC scheme. A FEC scheme that does not transmit original data is called a non-systematic scheme. In the latter case, the total amount of data transmitted is still higher than the amount of original data, to provide redundancy. For simplicity, but without loss of generality, we talk about systematic FEC schemes herein. The redundant FEC data units may be placed in their own packets, separate to the data packets in the data stream. Alternatively, or additionally, the FEC data units may be appended (or "piggybacked") to the original data packets in the data stream. For simplicity, but without loss of generality, we talk about separate original and FEC packets herein. When some of the original data packets are lost in the communication channel, the successfully arrived FEC data units and the successfully arrived data packets can be used to recover (at least some of) the lost data packets. That is, FEC reduces the packet loss seen by a decoder of the receiver, compared to the actual packet loss in the communication channel.

Figure 1:
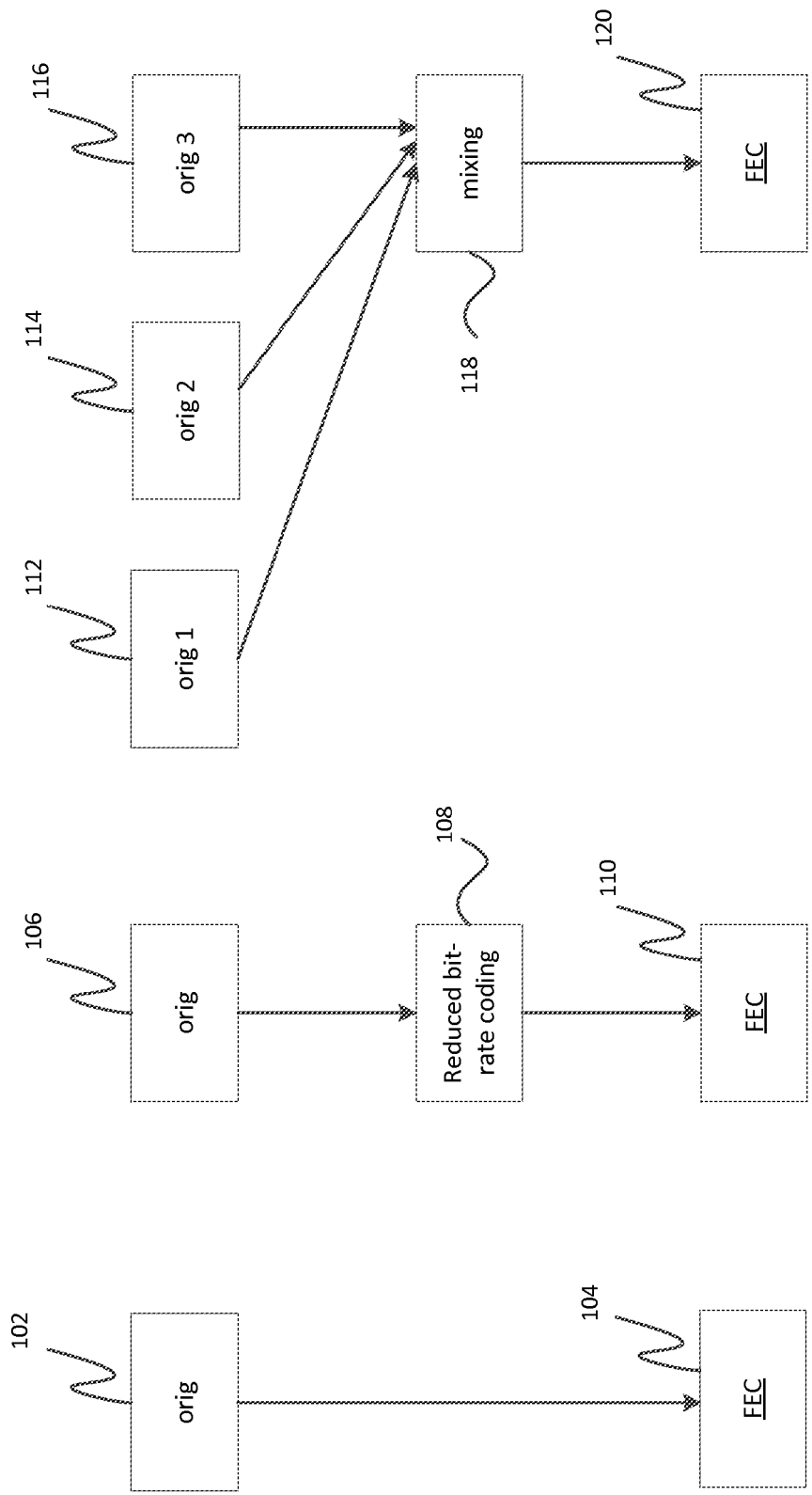
FIG. 1a illustrates a first example of how a FEC data unit may be generated.
FIG. 1b illustrates a second example of how a FEC data unit may be generated.
FIG. 1c illustrates a third example of how a FEC data unit may be generated.

FIGS. 1a, 1b and 1c illustrate three examples of how a FEC data unit may be generated.

As illustrated in FIG. 1a, a FEC data unit 104 may be generated as an exact copy of an original data packet 102 of the data stream. By including both the data packet 102 and the FEC data unit 104 in the data stream, the data in the data packet 102 is transmitted twice. Therefore if the data packet 102 is lost during transmission but the FEC data unit 104 is successfully received then the data in the data packet 102 can be successfully recovered at the receiver (using the FEC data unit 104).

As illustrated in FIG. 1b a module 108 may be used to generate a FEC data unit 110 which is a copy of an original data packet 106 encoded at a lower bit rate. If the data packet 106 is lost during transmission but the FEC data unit 110 is successfully received then the data in the data packet 106 can be at least partially recovered at the receiver based on the FEC data unit 110. It should be noted that if the data packets 102 and 106 have the same size (e.g. the same number of bits) then the FEC data unit 110 will have a smaller size (e.g. fewer bits) than the FEC data unit 104. Therefore, although the FEC data unit 104 may be more useful in recovering the data packet 102 than the FEC data unit 110 is in recovering the data packet 106, it may be beneficial to generate FEC data units as shown in FIG. 1b since the FEC data unit 110 uses less of the available bit rate on the communication channel for the data stream than the FEC data unit 104 uses.

As illustrated in FIG. 1c a mixing module 118 may be used to generate a FEC data unit 120 from a plurality of the original data packets, e.g. data packets 112, 114 and 116. For example the mixing module 118 may determine the bit-by-bit result of an XOR function applied to the three data packets 112, 114 and 116 to generate the FEC data unit 120. In another approach, data packets 112, 114 and 116 are combined byte-by-byte using Galois field GF($2^8$) arithmetic to generate the FEC data unit 120. In this sense the FEC data unit 120 is the result of combining or mixing the original data packets 112, 114 and 116. If one of the data packets 112, 114 and 116 is lost during transmission but the other two data packets and the FEC data unit 120 are successfully received then the data in the lost data packet can be successfully recovered at the receiver (using the other two data packets and the FEC data unit 120).

It can therefore be seen that FEC data units may be generated in a number of different ways. Different FEC schemes describe different ways in which the FEC data units are to be generated. A FEC scheme may describe factors relating to the generation of the FEC data units, such as: the number of FEC data units that are generated; which data packets are used to generate the FEC data units; how the FEC data units are transmitted (e.g. as separate packets or by appending the FEC data units to the data packets); and where in the data stream the FEC data units are placed. The loss-recovery performance of a FEC scheme describes the ability of the FEC scheme to recover lost data packets at the receiver using the FEC data units.

Generally, increasing the number of FEC data units in the data stream improves the loss-recovery performance of a FEC scheme. However, increasing the number of FEC data units in the data stream comes at a cost of bit rate efficiency.

Loss-recovery performance of a FEC scheme largely depends on FEC overhead and FEC depth.

FEC overhead describes the amount of redundant data relative to the amount of original data (e.g., the number of FEC packets relative to the number of original packets). Higher overhead generally improves the loss-recovery performance of a FEC scheme. On the other hand, higher overhead comes at a cost of bit rate efficiency. If the coding bit rate of original data is kept unchanged, then increased redundancy leads to increased total bit rate. Alternatively, if the total bit rate is constrained, then increased redundancy comes at a price of reduced coding bit rate of original data.

FEC depth describes the displacement between the oldest and the newest of the data packets (including both of those data packets) that can be protected by (i.e. combined into) a FEC data unit. In other words, it describes the maximum number of original data packets that can be combined into a FEC data unit. Higher depth provides more possibilities of different combinations of data packets for the FEC data units, thus achieving higher flexibility of a FEC scheme, for example, to varying channel conditions. In one extreme example, where a FEC data unit is constrained to be a copy of one original data packet, higher depth provides a possibility for larger separation of the original data packet and its copy (the FEC data unit) in time. This is useful in bursty packet-loss conditions, since it minimizes the probability of both the original data packet and the copy (the FEC data unit) being lost in a burst on the communication channel.

Figure 2:
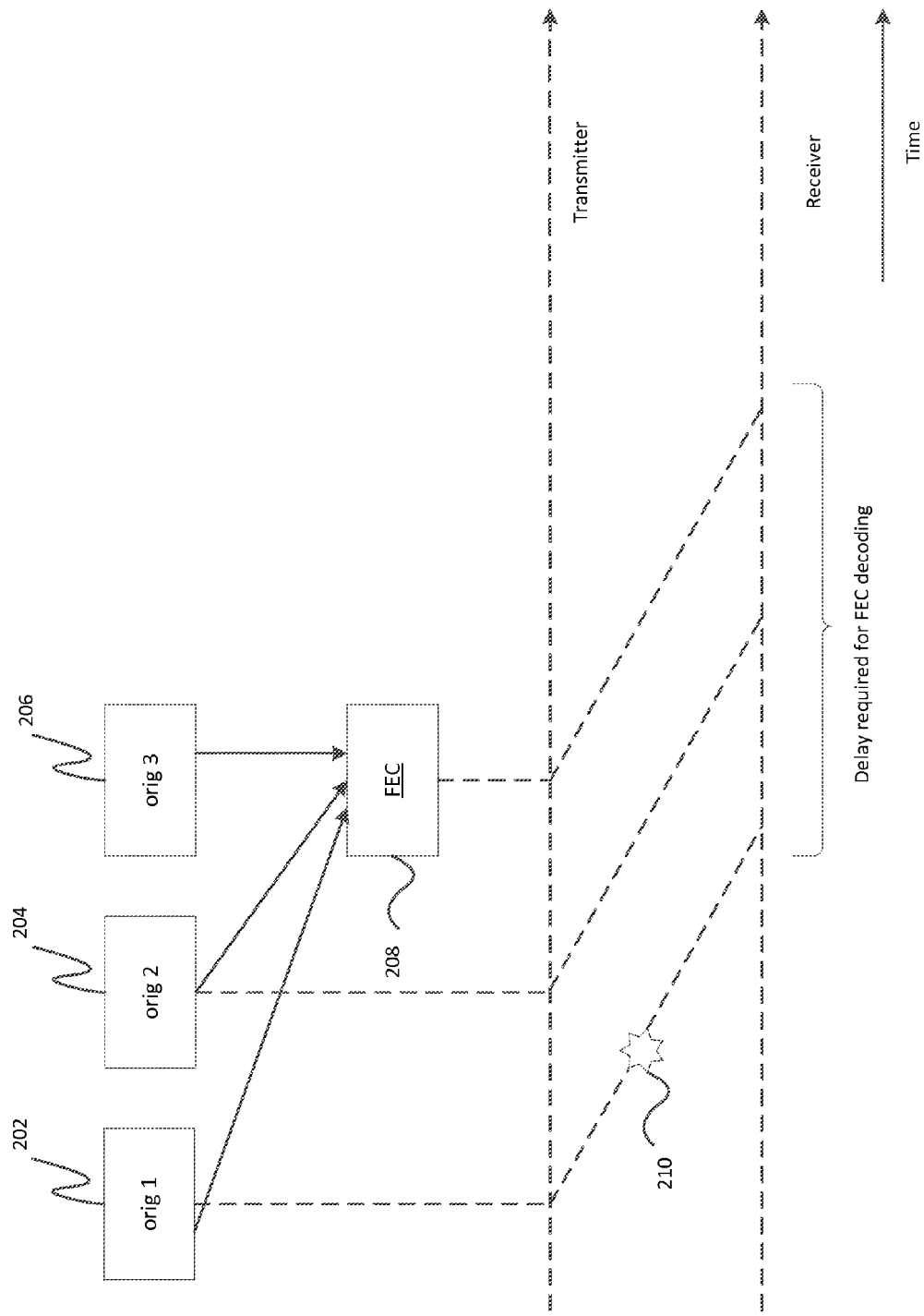
FIG. 2 is a timing diagram showing the transmission of data packets in a communication system.

The FEC depth is related to delay in the communication. A FEC data unit combines previously-generated original data packets, and therefore there is no additional algorithmic delay at the transmitter caused by using FEC. However, in order to reconstruct a lost data packet at the receiver, we assume a delay at the receiver, since the FEC data unit is generated and transmitted later than the data packets on which it is based. This can be seen in the timing diagram shown in FIG. 2. FIG. 2 shows a situation in which three of the data packets (202, 204 and 206) of the data stream are used to generate the FEC data unit 208. The FEC data unit cannot be generated until all three of the data packets 202, 204 and 206 have been generated. Therefore, the data packets 202 and 204 will be transmitted from the transmitter before the FEC data unit 208 is generated at the transmitter. Therefore, the earliest that the FEC data unit 208 can be transmitted is straight after the data packet 206. This scenario is shown in FIG. 2. The transmission of the data packets and the FEC data unit takes some finite amount of time. FIG. 2 depicts the loss (210) of the data packet 202 during the transmission over the lossy communication channel through the network. However, the data packets 204 and 206 and the FEC data unit 208 are all successfully received at the receiver. The data packets 204 and 206 and the FEC data unit 208 can be used to recover the lost data packet 202 at the receiver. However, the lost data packet 202 cannot be recovered until all three of: the data packets 204 and 206 and FEC data unit 208 have been received at the receiver. Therefore, as shown in FIG. 2, there is a delay required for FEC recovery of the data packet 202 between the time when the data packet 202 should have been received at the receiver (if it had not been lost) and the time at which the data packet can be recovered using the FEC data unit 208. If the delay requirement for the data stream is not satisfied, the lost data packet 202 will be declared as not decodable at the receiver prior to the arrival of the FEC data unit 208. This will most likely cause the performance of the FEC scheme to drop significantly.

However, this delay need not be necessarily introduced at the receiver by FEC as an additional delay. For example, the required delay may already exist at the receiver. One possible cause of delay at the receiver is the presence of a jitter buffer, as a jitter buffer introduces a delay into the data stream in order to mitigate random variations in packet arrival times (jitter).

For given channel conditions, FEC overhead, and FEC depth, the selection of optimal combinations/mixings of original data packets to form the FEC data units can be driven by optimizing a selected loss-recovery performance measure. Often a number of FEC packets are jointly optimized within an optimization window.

Examples of loss-recovery performance measures are:
(i) the number of losses that can be recovered;
(ii) the sum $\Sigma p_i$, where $p_i$ is the non-recovery probability of the ith data packet.
The sum includes original data packets within an optimization window;
(iii) the sum $\Sigma(p_i)^2$. Again, the sum includes original data packets within an optimization window. Squaring the non-recovery probabilities punishes higher non-recovery probabilities (i.e. outliers) more heavily; and
(iv) the sum $\Sigma w_i p_i$, where $w_i$ is a weight applied to the non-recovery probability of the ith data packet. The weights describe different levels of importance or sensitivity to loss of different data packets. Again, the sum includes original data packets within an optimization window. FEC schemes that use such a weighted performance measure are referred to as source-dependent FEC or uneven-error-protection FEC, because the protection provided to different data packets is different. This allows a greater level of protection to be provided for more important data packets of the data stream (e.g. data packets from a particular application or user or data packets having greater importance, e.g. different audio data packets and different video data packets may have different levels of protection provided to them by the FEC scheme). In this way the data packets can have different levels of priority in the FEC scheme.

Figure 3:
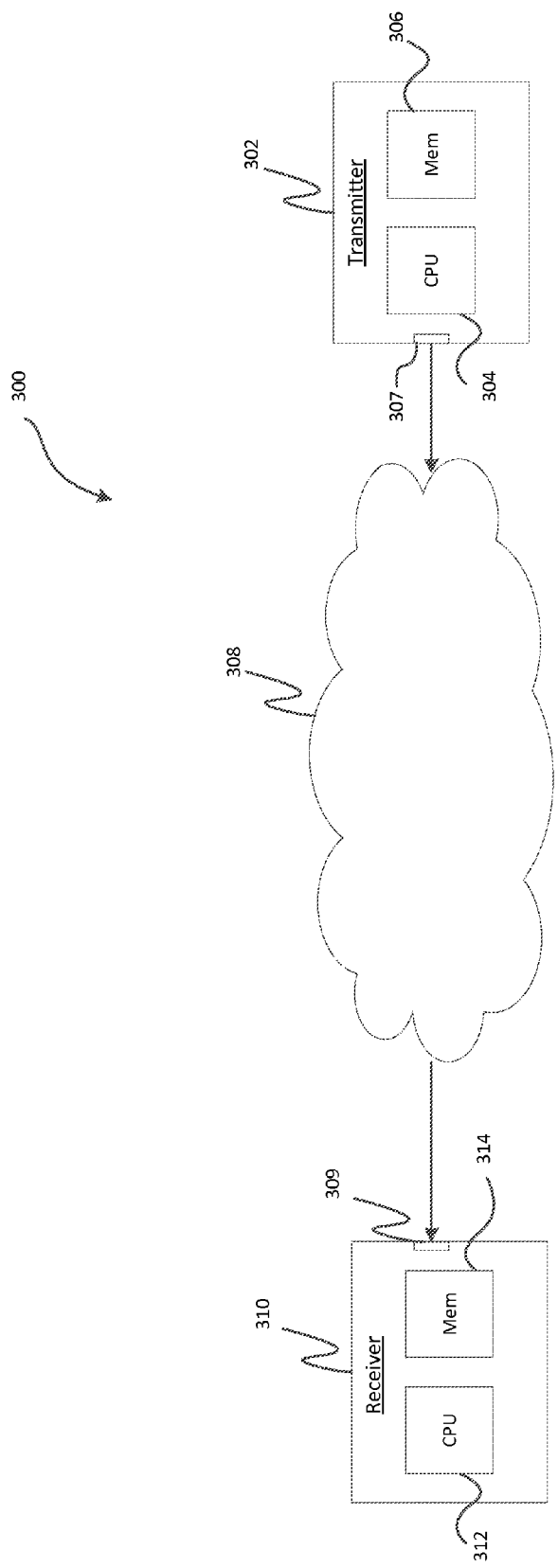
FIG. 3 shows a communication system.

A communication system 300 is now described with reference to FIG. 3. The communication system 300 comprises a transmitter 302, a network 308 and a receiver 310. The transmitter 302 comprises a processor 304 for processing data, a network interface 307 for the transmission (and receipt) of data across the network 308, and a memory 306 for storing data. The processor 304 may be implemented at the transmitter 302 in hardware or in software. Similarly, the receiver 310 comprises a processor 312 for processing data, a network interface 309 for receiving data (and transmission of data) across the network 308, and a memory 314 for storing data. The processor 312 may be implemented at the receiver 310 in hardware or in software.

The data stream may be transmitted over a communication channel through the network 308 to the receiver 310. Methods for transmitting a data stream over a communication channel through a network are known in the art, and as such are not described in detail herein. The receiver 310 may then process the received data packets (e.g. using the processor 312) to retrieve the data. This processing may involve depacketizing and decoding the data from the data stream. The data may be stored in the memory 314 at the receiver, or output from the receiver 310, e.g. to a user. The data in the data stream may relate to a real-time communication event (such as a voice call or a video call) between a user of the transmitter 302 and a user of the receiver 310. Alternatively, the data in the data stream may relate to a data transfer such as a file transfer between the transmitter 302 and the receiver 310. The data in the data stream may be any other suitable type of data.

The network 308 may be any suitable network which has the ability to provide a communication channel between the transmitter 302 and the receiver 310. The network 308 may be a packet-based network. The network 308 could be a Wide Area Network (WAN) or a Local Area Network (LAN). As examples, the network 308 may be an intranet, the internet or a telephony network such as a mobile telephone network. The transmitter 302 and receiver 310 may be implemented in any suitable apparatus or device for transmitting and receiving a data stream over the network 308 respectively. For example, the transmitter 302 and receiver 310 may be implemented as user devices such as personal computers or telephones which have the ability to connect to the network 308, or as other devices such as server nodes in a network.

Figure 4:
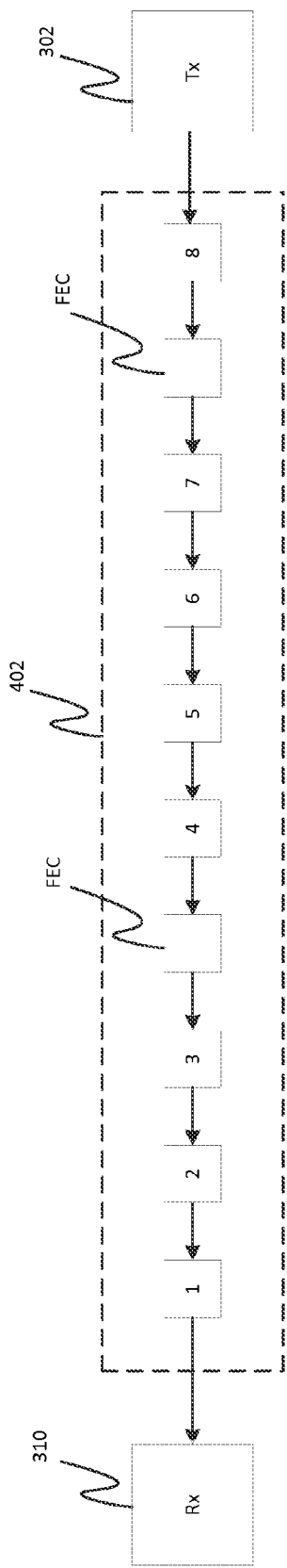
FIG. 4 is a representation of a data stream being transmitted in a communication system.

FIG. 4 shows a representation of a data stream 402 being transmitted in the communication system 300 from the transmitter 302 to the receiver 310. The data stream 402 includes eight data packets labelled 1 to 8 in FIG. 4. Only eight data packets are shown in FIG. 4 for clarity but the data stream may include many more than eight data packets. As shown in FIG. 4, the data stream also includes FEC data units (labelled "FEC"). In FIG. 4 the FEC data units are shown as separate packets to the data packets in the data stream. However, the FEC data units may be appended (or "piggybacked") to the data packets. When the FEC data units are appended to the data packets the FEC data units do not require their own packet formatting, such as packet headers, and as such the amount of data in the data stream required for the FEC data units may be slightly reduced. However, appending the FEC data units to the data packets means that if a data packet is lost then so is the FEC data unit appended to that lost data packet. A FEC data unit appended to a data packet protects other data packets than the data packet to which it is appended. As explained above, in a non-systematic scheme FEC data only can be sent i.e. no original data packets of the data stream.

As described above (e.g. in relation to FIGS. 1a to 1c), the FEC data units are generated based on a set of the data packets of the data stream. The set may include one or more data packet. A FEC data unit may, for example, be an exact copy of an original data packet (as illustrated in FIG. 1a), or a copy of an original data packet encoded at a lower bit rate (as illustrated in FIG. 1b), or a combination/mixing of original data packets (as illustrated in FIG. 1c). In one approach, data packets are combined bit-by-bit using a bitwise XOR operation defined as (0 XOR 0)=(1 XOR 1)=0 and (0 XOR 1)=(1 XOR 0)=1. In another approach, data packets are combined byte-by-byte using Galois field $GF(2^8)$ arithmetic. FEC data units may be generated by combining two or more of the data packets.

The communication channel through the network 308 is lossy, meaning that some of the data bits in the data stream will be lost during transmission from the transmitter 302 to the receiver 310. The FEC data units may be used at the receiver 310 to recover data bits which are lost during transmission. The term "lost original data" includes data bits which are corrupted beyond repair during transmission as well as data bits which are lost during transmission.

As discussed above, during FEC decoding, uncertainties may arise as to the correct bit value or bit sequence value of a lost packet. This is explained further by considering an example where three packets are transmitted: original packets x1 and x2, and a FEC packet that is a mix of the two original packets, f1=mix(x1,x2), where mixing is based on a logic bitwise XOR function.

If packet x1 is lost and packets x2 and f1 are received, then packet x1 can be recovered by mixing (bitwise XORing) packets x2 and f1. For example, if the bit at a certain position in x2 is equal to 1 and the bit at the same position in f1 is equal to 0, then the bit at the same position in x1 is recovered as (1 XOR 0)=1.

On the other hand, if both original packets x1 and x2 are lost and only the FEC packet f1 is received, then packets x1 and x2 cannot be recovered by the FEC decoder. For example, if the bit at a certain position in f1 is equal to 0, then there remains an uncertainty if the bits at the same position in x1 and x2 are both 0 or both 1. That is, if the bit 0 in f1 was obtained by (0 XOR 0) or (1 XOR 1).

Figure 5:
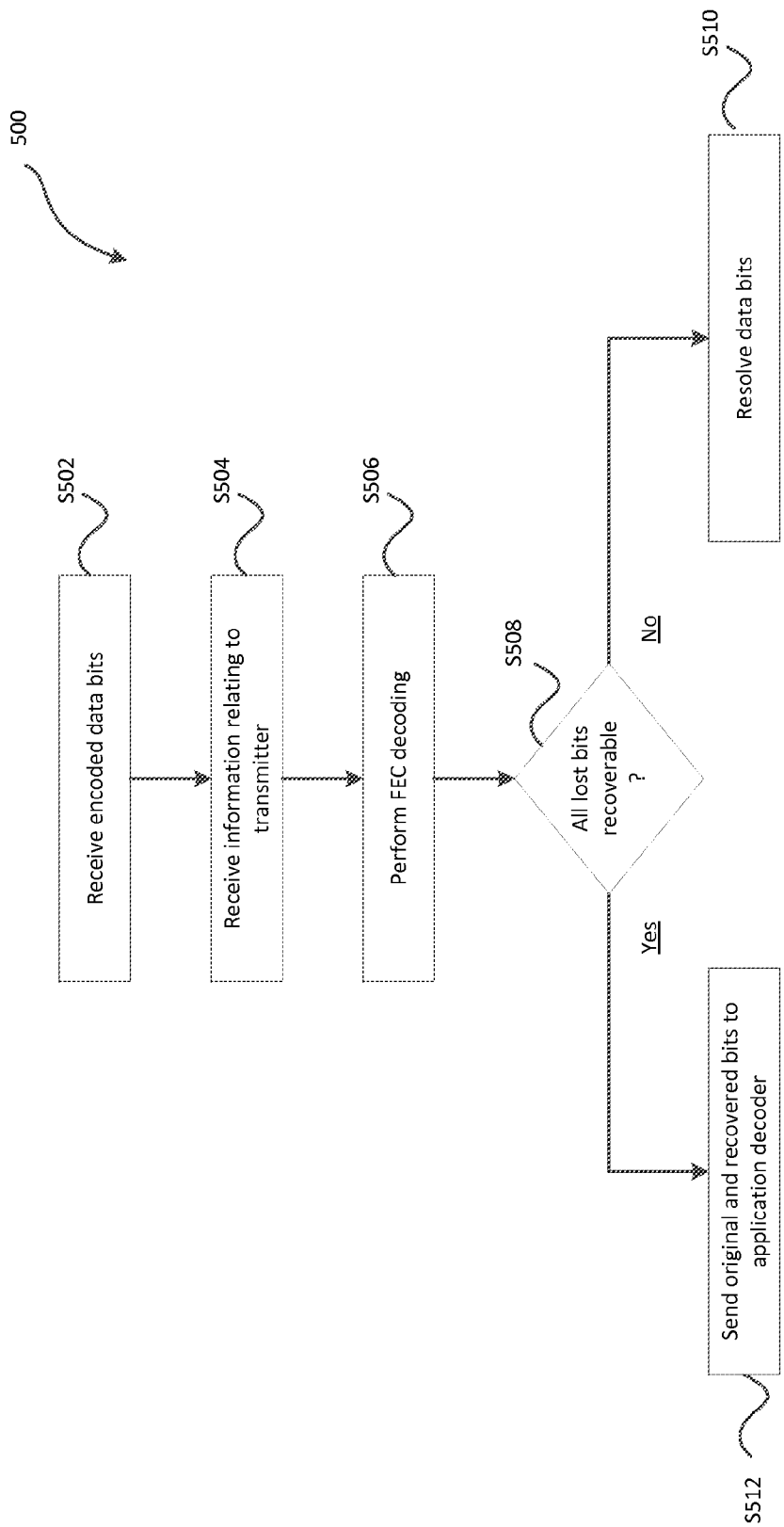
FIG. 5 is a flow chart for a process of resolving data bits.

A process of resolving these uncertainties will now be discussed with reference to FIG. 5. The steps shown in FIG. 5 are implemented at the processor 312 of the receiver 310.

At step S502, the receiver 310 receives encoded data bits from a transmitter 302 over a lossy communication channel established over the network 308.

At step S504, the receiver 310 receives information relating to the transmitter 302. The information relating to the transmitter may be represented by encoded parameter values inserted in the packets of the data stream during processing of the data to be transmitted by the processor 304. The encoded parameter values are thereby received at the receiver 310 and decoded by processor 312 at the receiver to extract the information relating to the transmitter 302. Alternatively the information relating to the transmitter may be transmitted from the transmitter 302 to the receiver 310 over the network 308 separately to the data stream. It will be appreciated that the information relating to the transmitter 302 may be received at the receiver 310 without being transmitted over the network 308, for example the information relating to the transmitter 302 may be input locally at the receiver 310 by a user.

In one example, the original packets are generated by encoding a source (e.g., audio or video) by a source encoder (e.g., audio or video encoder) and packetizing the resulting bit streams. Therefore, the uncertainties may be potentially resolved by analyzing the candidate bit streams, and using the available knowledge about the source, and/or the encoding process, and/or the packetization process. In this example the information related to the transmitter may include source information (audio/video), source encoder name, source encoder mode, encoding bit rate, and packetization protocol.

At step S506, the processor 312 performs FEC decoding on the received encoded data bits. As discussed above, the FEC decoding at step S506 does not guarantee recovery of all lost original bits due to uncertainties in the recovery process (i.e. where a bit or sequence of bits could take more than one value). Therefore at step S508 the processor 312 determines whether there are any remaining uncertainties after the FEC decoding at step S506. That is, at step S508 the processor 312 determines whether all lost bits were recoverable following the FEC decoding at step S506. The processor 312 may implement the determining step by checking if each bit has an uncertainty or not.

If the processor 312 determines at step S508 that all lost bits were recovered during the FEC decoding at step S506, the process proceeds to step S512. At step S512 the original and recovered bits are sent to an application decoder at the processor 312 to be decoded by the application decoder. The decoded data may be stored in the memory 314 at the receiver, or output from the receiver 310, e.g. to a user.

Referring back to step S508, if the processor 312 determines at step S508 that all lost bits were not recovered during the FEC decoding at step S506 due to uncertainties as to the correct bit value, the process proceeds to step S510.

At step S510 the processor 312 resolves the uncertainties as to the correct bit value or bit sequence value. Step 510 involves analyzing candidate options for one or more lost bit values. This analysis is implemented at processor 312 using the information relating to the transmitter 302 received at step S504.

In some cases it will be possible to resolve uncertainties for individual bit values by looking at the individual bits. In other cases, the process will rely on joint analysis of bit sequence values.

The analysis relies on the fact that the original packets are not totally random, but are generated according to certain rules. Given these rules, some original packet bit values (or bit sequence values) that could result in a given FEC packet bit value (or bit sequence values) can be deemed as impossible or as having low probabilities, and therefore be excluded as candidate options.

The analysis of candidate options at step S510 may be implemented in a number of different ways.

For example the analysis of candidate options at step S510 may include identifying invalid candidate bit sequence values.

Alternatively or additionally the analysis of candidate options at step S510 may include identifying invalid or low probability candidate parameter values: this may be based for example on knowledge of marginal probability distributions of parameter values and may alternatively or additionally be based on correlations between different parameters. Both marginal probability distributions and correlations between parameters may be pre-stored and/or updated in real time using successfully received/recovered bits.

Alternatively or additionally the analysis of candidate options at step S510 may include minimizing quality degradations of the resulting decoded signal. This analysis comprises identifying if one or more of the candidate options will result in degradation in quality following subsequent decoding at an application decoder. This may be implemented by running a signal analyser or a quality estimator at the receiver 310.

It will be appreciated that the analysis of candidate options at step S510 may include any combination of the above described methods.

At step S510, candidate options (bit values or bit sequence values) which are not viable options for the lost original data can be discarded, and the uncertainties as to the correct bit value or bit sequence value in the recovery process of the lost original data may be resolved using the remaining candidate options (those not discarded).

In some cases it will not be possible to resolve the entire bit streams of the original packets lost over the communication channel. However, in many applications it is useful to resolve at least some parts (e.g., beginnings of the bit streams), because this enables decoding of useful information/parameters. As mere examples these parameters may be perceptually-important parameters describing a speech/audio frame, or first macro blocks of a video frame.

Although in some cases it may be sufficient to perform the bit stream analysis without running the application decoder, in many situations a major benefit can be obtained by running the application decoder on candidate bit sequences and evaluating candidate decoded parameter values.

Figure 6:
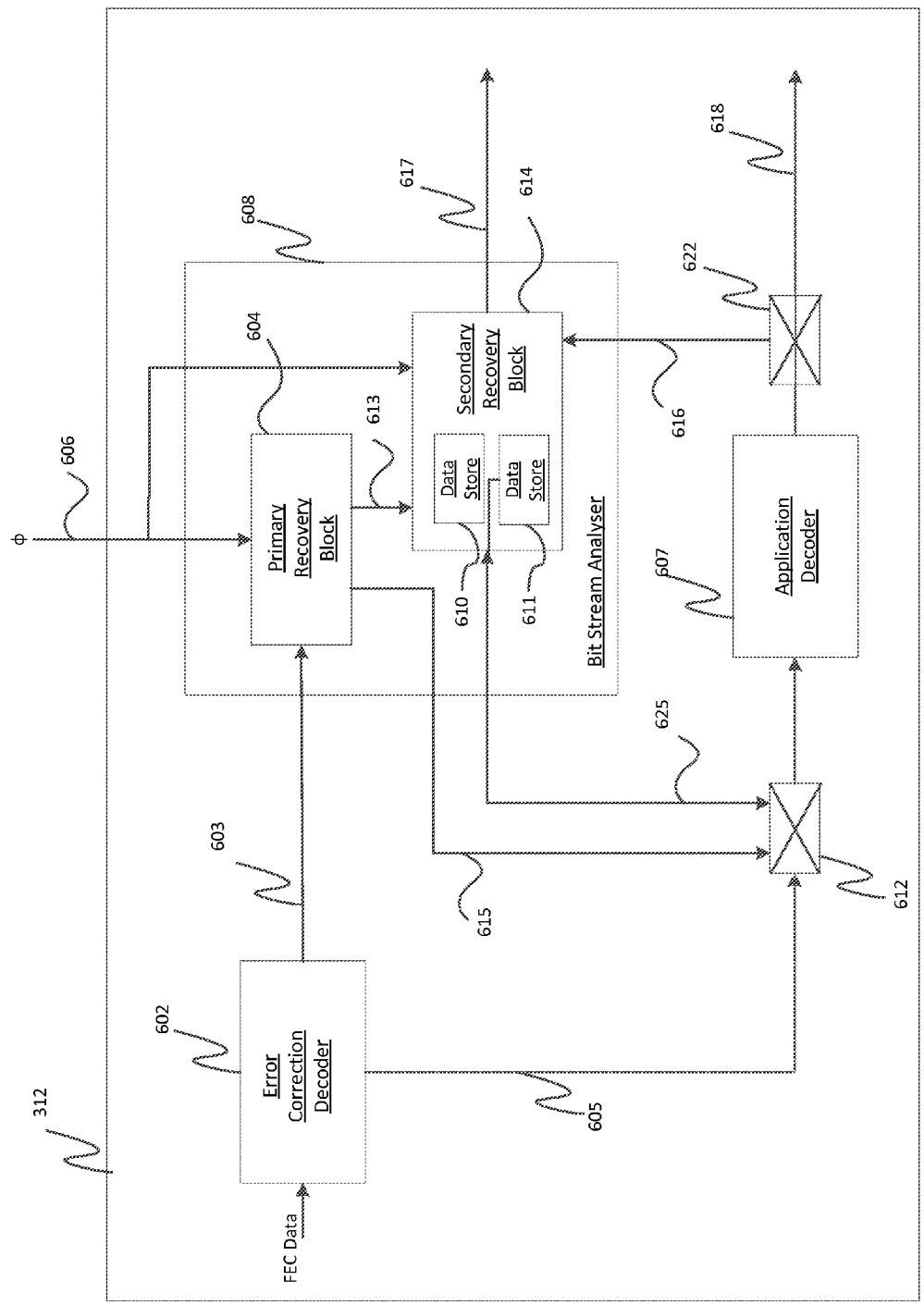
FIG. 6 is a schematic of a processor at a receiver.

The bit stream analysis is now described in more detail with reference to FIG. 6. FIG. 6 is a schematic representation of processor 312 at the receiver 310. Each of the elements of the processor 312 may be implemented in hardware or in software. Upon receiving a data stream from the transmitter 302, an error correction decoder 602 (i.e. FEC decoder) at the receiver 310 receives the data stream.

If all lost bits are recoverable (determined at step S508) then the data bits received at the receiver 310 and the recovered bits are supplied on line 605 to a first switching means 612. The first switching means 612 is controllable to supply the data bits received at the receiver 310 and the recovered bits to an application decoder 607 to be decoded. Once decoded the application decoder 607 is arranged to output the decoded bits on line 618 via a second switching means 622. The decoded bits may be stored in the memory 314 at the receiver 310, or output from the receiver 310, e.g. to a user.

If all lost bits are not recoverable (determined at step S508) then the data bits received at the receiver 310 and the unrecovered bits are supplied on line 603 to a bitstream analyser 608.

The bit stream analyser 608 comprises a primary recovery block 604 and a secondary recovery block 614. The primary recovery block 604 is arranged to receive the data bits with one or more unrecoverable bits on line 603. The primary recovery block 604 is further arranged to receive information related to the transmitter (denoted φ) on line 606 which may include the available knowledge about the source, and/or the encoding process, and/or the packetization process and/or the rules on how the original packets are generated at the transmitter 302.

The primary recovery block 604 is operable to attempt to resolve the uncertainties of the one or more unrecoverable bits output from the FEC decoder (received on line 603) using the information related to the transmitter (φ). That is, the primary recovery block 604 resolves uncertainties using bit stream analysis to identify invalid bit streams using the information related to the transmitter (φ).

In some cases the primary recovery block 604 will be able to resolve all the uncertainties of the one or more unrecoverable bits. That is, primary recovery block 604 is able to implement step S510 (shown in FIG. 5). In this scenario, the primary recovery block 604 is arranged to supply the data (including the resolved bits) to the first switching means 612 on line 615. The first switching means is controllable to supply the data (including the resolved bits) to the application decoder 607.

In some cases the primary recovery block 604 will not be able to resolve all the uncertainties of the one or more unrecoverable bits received on line 603. That is, a plurality of candidate bit values will still remain for at least one bit in the data. In this scenario, the primary recovery block 604 is arranged to supply a plurality of candidate bit sequences on line 613 to the secondary recovery block 614.

The secondary recovery block 614 comprises a first data store 610 which is arranged to store the plurality of candidate bit sequences. The secondary recovery block 614 comprises a second data store 611 which is arranged to store decoded results from bits which have previously been decoded by the application decoder 607. The processor 312 is arranged to control the second switching means 622 to supply the bits which have been previously decoded by the application decoder 607 to the secondary recovery block 614 on line 616.

The secondary recovery block 614 is arranged to supply each of the candidate bit sequences to the first switching means 612 on line 625. The first switching means is controllable to supply the candidate bit sequences to the application decoder 607. The application decoder is arranged to decode the candidate bit sequences to output decoded candidate results. The decoded candidate results output from the application decoder 607 are supplied to the secondary recovery block 614 on line 616 via the second switching means 622. Due to the uncertainties with regards to the decoded candidate results, the processor 312 controls the second switching means 622 such that the decoded candidate results output from the application decoder 607 are not output on line 618 such that they are not stored in the memory 314 at the receiver 310, or output from the receiver 310, e.g. to a user.

The secondary recovery block 614 is operable to attempt to exclude decoded candidate results using the information related to the transmitter (φ) received on line 606, and by analyzing the decoded results which are stored in the second data store 611.

The analysis can be facilitated by the fact that the ambiguous original packets (their bit streams and encoded parameters) are often correlated with each other. Also, the ambiguous packets are often correlated with earlier decoded original packets.

In some cases, based on this analysis, the secondary recovery block 614 will be able to exclude all but one decoded candidate result. That is, the secondary recovery block 614 operates in addition to recovery block 604 to implement step S510 (shown in FIG. 5). In this scenario the secondary recovery block 614 is arranged to output the decoded candidate result on line 617. The decoded bits output on line 617 may be stored in the memory 314 at the receiver 310, or output from the receiver 310, e.g. to a user.

It will be apparent that in the bit stream analysis described above, the first switching means 612 has three input connections on lines 605, 615 and 625. During the bit stream analysis the first switching means 612 is arranged to receive data on one of its three inputs and is controllable to supply the received data to the application decoder 607. That is, the first switching means 612 will receive one of: (i) data bits received at the receiver 310 and bits recovered by the error correction decoder 602 on line 605, (ii) bits received at the receiver 310 and bits resolved by the primary recovery block 604 on line 615, and (iii) candidate bit sequences on line 625. The data that the first switching means 612 receives on one of its three inputs depends on the success of the recovery of lost bits at the error correction decoder 602, and the success of the primary recovery block 604 resolving uncertainties of one or more unrecoverable bits output from the FEC decoder.

It will also be apparent that the architecture of the processor 312 will depend on the how the analysis of candidate options (at step S510 of FIG. 5) is implemented. For example if the analysis of candidate options only comprises identifying invalid candidate bit sequence values (implemented by the primary recovery block 604) then the secondary recovery block 614 may not be required. Similarly, if the analysis of candidate options only comprises identifying invalid or low probability decoded candidate parameter values (implemented by the secondary recovery block 614) then the primary recovery block 604 may not be required. In this case, the secondary recovery block 614 will be arranged to receive the data bits with one or more unrecoverable bits output from the error correction decoder 602 and determine the candidate bit sequences that are supplied to the application decoder in the process of resolving the uncertainties of the one or more unrecoverable bits.

In one embodiment of the invention, the transmitter 302 is aware of the receiver's 310 ability to resolve uncertainties after FEC decoding. An FEC encoder at the transmitter 302 can be optimized with the knowledge that the receiver 310 has the ability to resolve uncertainties after FEC decoding. This is discussed in further detail with reference to FIG. 7.

Figure 7:
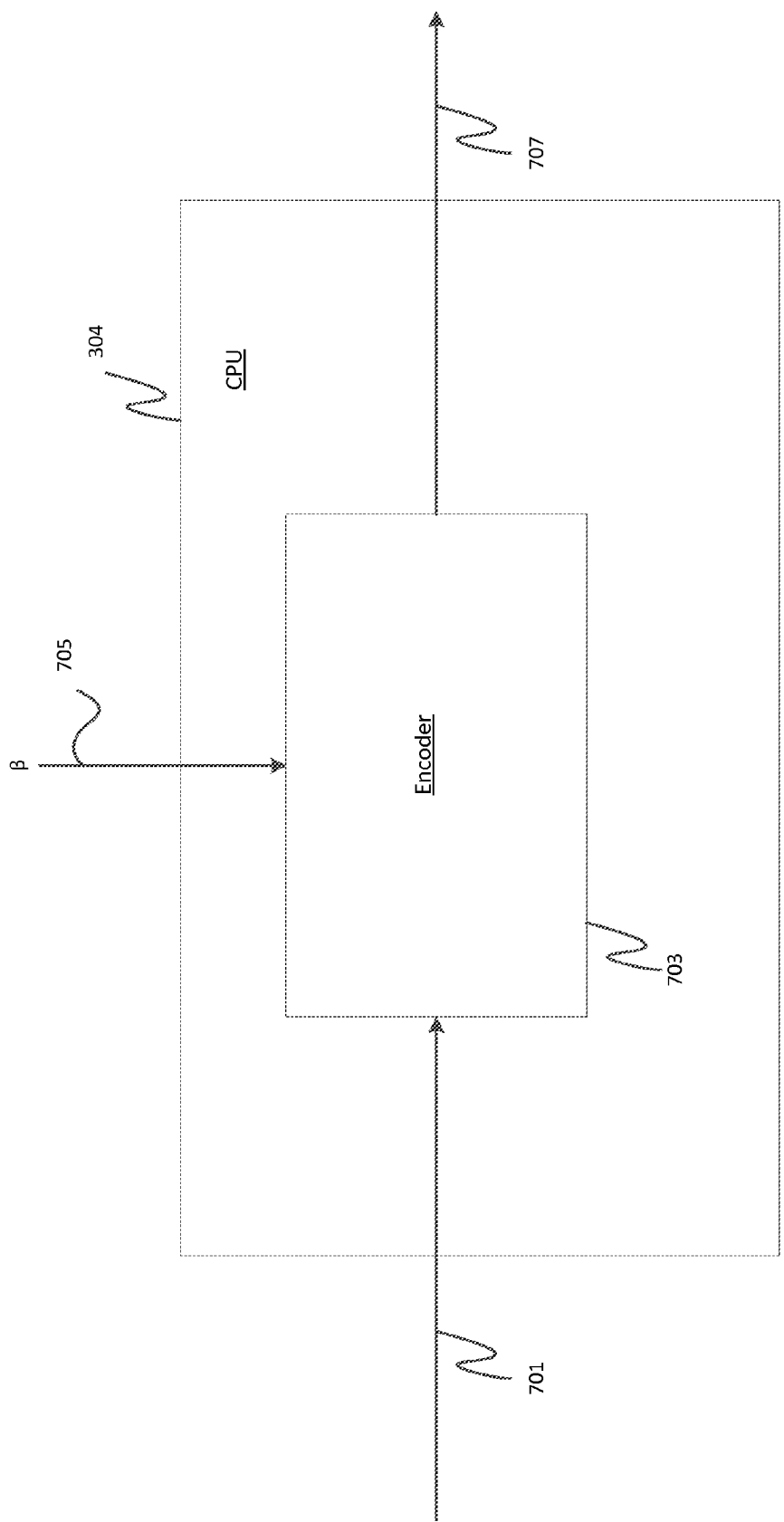
FIG. 7 is a schematic of a processor at a transmitter.

FIG. 7 is a schematic representation of processor 304 at the transmitter 302. For simplicity the processor 304 is shown as having an FEC encoder 703, it will be appreciated that the processor may include further modules used in the transmission of data not shown in FIG. 7. The FEC encoder 703 is arranged to receive encoded information (encoded data bits) output from a source encoder (not shown in FIG. 7) on line 701. The source encoder may for example be an audio or video encoder. The FEC encoder 703 is further arranged to receive information relating to the receiver (β) on line 705 and output encoded data on line 707 for transmission over the network 308. In operation, the FEC encoder 703 encodes the information received on line 701. That is, the FEC encoder 703 attempts to protect the source-encoded information by adding redundancy in accordance with a correction scheme that is optimized based on the information relating to the receiver ($\beta$) received on line 705.

In one embodiment of the invention the FEC optimization may be implemented by running offline "training". That is, it will be appreciated that there will be many different ways to generate the FEC data, for example whilst FIG. 1c shows a FEC data unit 120 generated from three original data packets, any number of original data packets may be combined to generate a FEC data unit and therefore there is a large optimization space. By running offline simulations it is possible to determine an FEC scheme which is optimized to give the best performance according to a particular measure. As mere examples to illustrate the concept, this measure may be packet loss which can be calculated by analysing the simulation results i.e. the number of packets sent from the transmitter, the number of packets received at the receiver, the number of packets recovered by the FEC decoder and the number of packets further recovered by resolving uncertainties after FEC decoding (if this further processing is applied at the receiver). If video data is to be transmitted across the network, the measure may be a level of video quality. Video quality evaluation techniques are well known in the art and will not be discussed herein.

These simulations may include determining the performance of each possible FEC scheme (i.e. of each permutation of how the FEC data units can be generated) over multiple realisations of the communication channel, for example the simulations may include determining the performance of each possible FEC scheme when simulating the channel suffering from various degrees of packet loss.

The offline "training" may include running simulations where the receiver 312 comprises only a FEC decoder 602, and where the receiver 312 comprises a FEC decoder and is able to resolve remaining uncertainties after FEC decoding (having elements shown in FIG. 6). It will be appreciated that the FEC scheme that provides the best performance for the scenario where the receiver 312 comprises only a FEC decoder 602 may be different to the FEC scheme that provides the best performance for scenario where the receiver 312 comprises a FEC decoder and is able to resolve remaining uncertainties after FEC decoding.

The FEC encoder 703 may determine the receiver's ability to resolve uncertainties after FEC decoding in a number of different ways. In one example the FEC encoder 703 is implemented by communication client software (provided by a software provider associated with the communication system 300) executed at the transmitter which allows the transmitter to engage in calls and other communication session over network 308. Where the FEC decoding (and resolving remaining uncertainties after FEC decoding) is implemented by executing communication client software at the receiver, provided by the same software provider which provides the communication client software which implements the FEC encoder 703, the FEC encoder 703 is able to determine the receiver's ability to resolve uncertainties after FEC decoding by reading the version number of the communication client software which is executed at the receiver. In another example, the FEC encoder 703 may be notified of the receiver's ability to resolve uncertainties after FEC decoding by data being fed back from the receiver 310 over the network to the transmitter 302. In yet another example, the FEC encoder 703 may determine the receiver's ability to resolve uncertainties after FEC decoding by the user manually supplying this information to the FEC encoder 703. The information relating to the receiver ($\beta$) received on line 705 comprises information indicating the receiver's ability to perform FEC decoding and resolve uncertainties after FEC decoding.

Once the FEC encoder 703 has determined whether the receiver has the ability to resolve uncertainties after FEC decoding the FEC encoder 703 is able to select the FEC scheme optimized for the receiver's capabilities.

In the various embodiments described above FEC data is used. In alternative embodiments, other types of correction data may be used instead of FEC data provided that the correction data allows the data stream units of a lost packet to be recovered using the correction data at the receiver.

The above examples exemplify how the space of candidate bit values is formed in the case of bitwise XOR mixing. Similarly, candidate bit streams are formed for other mixing ways. For example, in Galois field $GF(2^8)$ case the candidate bit streams are formed byte-by-byte.

The above examples exemplify the remaining uncertainty in one FEC packet that represents a mix of two original packets. Similarly, the uncertainties can be jointly resolved for a higher number of FEC packets and for a higher number of original packets being mixed in FEC packets.

Generally, any of the functions described herein can be implemented using software, firmware, hardware (e.g., fixed logic circuitry), or a combination of these implementations. The terms "module," "functionality," "component" and "logic" as used herein generally represent software, firmware, hardware, or a combination thereof. In the case of a software implementation, the module, functionality, or logic represents program code that performs specified tasks when executed on a processor (e.g. CPU or CPUs). The program code can be stored in one or more computer readable memory devices. The features of the techniques described below are platform-independent, meaning that the techniques may be implemented on a variety of commercial computing platforms having a variety of processors.

For example, the user terminals may also include an entity (e.g. software) that causes hardware of the user terminals to perform operations, e.g., processors functional blocks, and so on. For example, the user terminals may include a computer-readable medium that may be configured to maintain instructions that cause the user terminals, and more particularly the operating system and associated hardware of the user terminals to perform operations. Thus, the instructions function to configure the operating system and associated hardware to perform the operations and in this way result in transformation of the operating system and associated hardware to perform functions. The instructions may be provided by the computer-readable medium to the user terminals through a variety of different configurations.

One such configuration of a computer-readable medium is signal bearing medium and thus is configured to transmit the instructions (e.g. as a carrier wave) to the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may us magnetic, optical, and other techniques to store instructions and other data.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

According to a first embodiment of the invention there is provided a method of processing encoded data bits at a receiver, said encoded data bits transmitted from a transmitter to the receiver over a lossy communication channel established over a network, the method comprising: receiving the encoded data bits over the communication channel, the encoded data bits including redundant data units; decoding the encoded data bits at an error correction decoder, wherein the recovery of lost data is implemented at the error correction decoder using at least one of the redundant data units; determining if at least one data bit is unable to be recovered due to the decoder finding a plurality of candidate bit values for the at least one data bit; receiving information relating to said transmitter over the network; analyzing the plurality of candidate bit values to exclude at least one of the candidate bit values for the at least one data bit using the information relating to said transmitter; and resolving the at least one data bit based on said analysis.

The information relating to said transmitter may be received over the network.

When the step of decoding operates on sequences of data bits and finds a plurality of candidate bit values for each data bit, the method may further comprise analyzing the plurality of candidate bit values for each bit in a sequence using the information relating to said transmitter, to determine most likely candidate bit values for the sequence.

Preferably, the information relating to said transmitter includes at least one of: information on a source of the data bits prior to being encoded; information on an encoding process used to encode the encoded data bits; information on a packetization process used to packetize the encoded data bits; and information on predetermined rules followed by the transmitter in generating the encoded data bits.

The analyzing may further comprise identifying if one or more of the plurality of candidate bit values for the at least one data bit will result in a degradation in quality following a subsequent decoding step.

Preferably, the step of analyzing comprises decoding the candidate bit values using an application decoder to generate a candidate decoded result, and using the information related to said transmitter to exclude invalid or low probability candidate bit values based on the candidate decoded result.

The method may further comprise the application decoder decoding recovered or resolved data bits to generate decoded data bits; and storing the decoded data bits for use in excluding invalid or low probability candidate decoded results.

The method may further comprise selectively supplying candidate bit values to the application decoder to decode the candidate bit values when candidate bit values cannot be resolved using the information relating to said transmitter.

The candidate decoded result may represent a parameter of an original data unit, the analyzing may comprise excluding candidate decoded results representing invalid or low probability values for the parameter based on at least one of: knowledge of marginal probability distributions of parameter values; and correlations between different parameter values.

The error correction decoder may implement a forward error correction scheme.

The encoded data bits received at the receiver may further include original data units according to a systematic correction scheme.

When the encoded data bits received at the receiver further include original data units according to a systematic correction scheme, the encoded data bits may include redundant data units which have been generated from the original data units in one of the following ways: i) as an exact copy of the original data units; or ii) as a copy of the original data units encoded at the transmitter at a lower bit rate than the original data units; or iii) by combining a plurality of original data units.

When the redundant data units have been generated from the original data units by combining a plurality of original data units, the original data units may be combined bit-by-bit using a bitwise XOR operation or byte-by-byte using Galois field GF ($2^8$) arithmetic.

The redundant data units received at the receiver may represent original data and redundant data according to a non-systematic correction scheme.

The network may be a packet based network.

According to a second embodiment of the invention there is provided a receiver for processing encoded data bits, said encoded data bits transmitted from a transmitter to the receiver over a lossy communication channel established over a network, the receiver comprising: a receiving module for receiving the encoded data bits over the communication channel, the encoded data bits including redundant data units; an error correction decoder for decoding the encoded data bits, wherein the recovery of lost data is implemented at the error correction decoder using at least one of the redundant data units; a determining module for determining if at least one data bit is unable to be recovered due to the decoder finding a plurality of candidate bit values for the at least one data bit; a receiving module for receiving information relating to said transmitter; an analyzing module for analyzing the plurality of candidate bit values to exclude at least one of the candidate bit values for the at least one data bit using the information relating to said transmitter; and a resolving module for resolving the at least one data bit based on said analysis.

The receiver may further comprise an application decoder configured to decode recovered or resolved data bits to generate decoded results and selectively operable to decode candidate bit values to generate candidate decoded results for use by the analyzing means and the resolving means.

The receiver may further comprise a switching module for supplying candidate bit values to the application decoder.

The application decoder may be a voice decoder or a video decoder.

According to a third embodiment of the invention there is provided a method of processing encoded data bits at a receiver, said encoded data bits transmitted from a transmitter to the receiver over a lossy communication channel established over a network, the method comprising: receiving the encoded data bits over the communication channel, the encoded data bits contained in packets and redundant data units; decoding the encoded data bits at an error correction decoder, wherein the recovery of lost packets is implemented at the error correction decoder using at least one of the redundant data units and at least one other packet; determining if at least one lost packet is unable be recovered due to the decoder finding a plurality of candidate bit values for at least one data bit in the lost packet; receiving information relating to said transmitter over the communication channel; analyzing the plurality of candidate bit values to exclude at least one of the candidate bit values for the at least one data bit using the information relating to said transmitter; and resolving one or more data bits of the at least one lost packet based on said analysis.

According to a fourth embodiment of the invention there is provided a method of processing data bits at a transmitter for transmission from the transmitter to a receiver over a lossy communication channel established over a network, the method comprising: receiving, at an error correction encoder, the data bits from a source encoder; encoding the data bits at the error correction encoder to output encoded data bits, the encoded data bits contained in packets and redundant data units in accordance with a correction scheme; and receiving at the error correction encoder information relating to the receiver, said information comprising an indication that the receiver comprises an error correction decoder for decoding the encoded data bits, wherein the recovery of lost data is implemented at the error correction decoder using at least one of the redundant data units, and that the receiver is arranged to: determine if at least one data bit is unable to be recovered due to the decoder finding a plurality of candidate bit values for the at least one data bit; receive information relating to said transmitter; analyze the plurality of candidate bit values to exclude at least one of the candidate bit values for the at least one data bit using the information relating to said transmitter; and resolve the at least one data bit based on said analysis; wherein the correction scheme used by the error correction encoder is optimized based on the information relating to the receiver.

According to a fifth embodiment of the invention there is provided a transmitter for processing data bits for transmission from the transmitter to a receiver over a lossy communication channel established over a network, the transmitter comprising: an error correction encoder arranged to receive the data bits from a source encoder and output encoded data bits, the encoded data bits contained in packets and redundant data units in accordance with a correction scheme, the error correction encoder comprising: a receiving module for receiving information relating to the receiver, said information comprising an indication that the receiver comprises an error correction decoder for decoding the encoded data bits, wherein the recovery of lost data is implemented at the error correction decoder using at least one of the redundant data units, and that the receiver is arranged to: determine if at least one data bit is unable to be recovered due to the decoder finding a plurality of candidate bit values for the at least one data bit; receive information relating to said transmitter; analyze the plurality of candidate bit values to exclude at least one of the candidate bit values for the at least one data bit using the information relating to said transmitter; and resolve the at least one data bit based on said analysis; wherein the correction scheme used by the error correction encoder is optimized based on the information relating to the receiver.

According to a sixth embodiment of the invention there is provided a communication system comprising a receiver and a transmitter described hereinabove.

The invention claimed is:

1. A method of processing encoded data bits at a receiver, said encoded data bits transmitted from a transmitter to the receiver over a lossy communication channel established over a network, the method comprising:
receiving the encoded data bits over the lossy communication channel, the encoded data bits including redundant data units, at least some original data of the encoded data being lost data during transmission over the lossy communication channel;
receiving transmitter information associated with generation of the received encoded data bits, the transmitter information comprising at least one of:
a source encoder name associated with an encoder used to generate the encoded data bits; or
a source encoder mode associated with the encoder used to generate the encoded data bits;
decoding the encoded data bits at an error correction decoder;
recovering at least some of the lost data at the error correction decoder based, at least in part, on at least one of the redundant data units;
determining at least one data bit of the lost data is unrecoverable at the error correction decoder based, at least in part, on the error correction decoder finding a plurality of candidate bit values for the at least one unrecoverable data bit;
analyzing the plurality of candidate bit values effective to exclude at least one of the candidate bit values for the at least one unrecoverable data bit based, at least in part, on using the received transmitter information associated with the generation of the encoded data bits to identify a bit value or a sequence of bit values of the plurality of candidate bit values as invalid; and
resolving the at least one unrecoverable data bit based on said analysis.

2. The method according to claim 1, wherein the transmitter information associated with the generation of the received encoded data bits is received over the network.

3. The method according to claim 1 further comprising:
responsive to the error correction decoder finding a plurality of candidate bit values for each data bit in a sequence of data bits, analyzing the plurality of candidate bit values for each bit in the sequence of data bits based, at least in part, on using the transmitter information associated with the generation of the received encoded data bits to determine most likely candidate bit values for the sequence.

4. The method according to claim 1, wherein the transmitter information associated with generation of the received encoded data bits further comprises at least one of:
information on a source of the data bits prior to being encoded;
information on a packetization process used to packetize the encoded data bits; and
information on predetermined rules followed by the transmitter in generating the encoded data bits.

5. The method according to claim 1, wherein the analyzing further comprises identifying if one or more of the plurality of candidate bit values for the at least one data bit will result in a degradation in quality following subsequent decoding of the encoded data bits.

6. The method according to claim 1, wherein the analyzing further comprises:
decoding the candidate bit values using an application decoder to generate a candidate decoded result.

7. The method according to claim 6, the method further comprising:
decoding, using the application decoder, recovered or resolved data bits to generate decoded data bits; and
storing the decoded data bits for use in excluding invalid or low probability candidate decoded results.

8. The method according to claim 6, the method further comprising:
selectively supplying candidate bit values to the application decoder to decode the candidate bit values when candidate bit values cannot be resolved using the transmitter information.

9. The method according to claim 6, wherein the candidate decoded result includes at least one parameter describing an attribute of a frame associated with an original data unit, and wherein the analyzing comprises excluding candidate decoded results representing invalid or low probability values for the at least one parameter based on at least one of knowledge of:
marginal probability distributions of parameter values; or
correlations between different parameter values.

10. The method according to claim 1, wherein the error correction decoder is associated with decoding a forward error correction (FEC) scheme.

11. The method according to claim 1, wherein the encoded data bits received at the receiver further comprise original data units according to a systematic correction scheme.

12. The method according to claim 11, wherein the encoded data bits include redundant data units which have been generated from the original data units in one of the following ways:
- as an exact copy of the original data units;
- as a copy of the original data units encoded at the transmitter at a lower bit rate than the original data units; or
- by combining a plurality of original data units.

13. The method according to claim 12, wherein by combining a plurality of original data units, the original data units are combined bit-by-bit using a bitwise XOR operation or byte-by-byte using Galois field $GF(2^8)$ arithmetic.

14. The method according to claim 1, wherein the redundant data units received at the receiver represent original data and redundant data according to a non-systematic correction scheme.

15. The method according to claim 1, wherein the network is a packet based network.

16. A receiver for processing encoded data bits, the encoded data bits transmitted from a transmitter to the receiver over a lossy communication channel established over a network, the receiver comprising:
- a receiving module configured to:
  - receive the encoded data bits over the lossy communication channel, the encoded data bits including redundant data units, at least some original data of the encoded data being lost data during transmission over the lossy communication channel; and
  - receive transmitter information associated with generating the encoded data bits, the transmitter information comprising at least one of:
    - a source encoder name associated with an encoder used to generate the encoded data bits; or
    - a source encoder mode associated with the encoder used to generate the encoded data bits;
- an error correction decoder configured to:
  - decode the encoded data bits; and
  - recover at least some of the lost data bits based, at least in part, on at least one of the redundant data units;
- a determining module configured to:
  - determine when at least one data bit of the lost data is unrecoverable by the error correction decoder due to the error correction decoder finding a plurality of candidate bit values for the at least one unrecoverable data bit;
- an analyzer module configured to:
  - analyze the plurality of candidate bit values effective to exclude at least one of the candidate bit values for the at least one unrecoverable data bit based, at least in part, on using the transmitter information associated with generating the encoded data bits to identify a bit value or a sequence of bit values of the plurality of candidate bit values as invalid; and
- a resolving module configured to:
  - resolve the at least one unrecoverable data bit based on said analysis.

17. The receiver according to claim 16, the receiver further comprising:
- an application decoder configured to:
  - decode recovered or resolved data bits to generate decoded results; and
  - selectively decode candidate bit values to generate candidate decoded results for use by the analyzer module and the resolving module.

18. The receiver according to claim 17, the receiver further comprising a switching module configured to:
- supply the candidate bit values to the application decoder.

19. The receiver according to claim 17, wherein the application decoder comprises:
- a voice decoder; or
- a video decoder.

20. A system comprising:
- at least one processor; and
- one or more computer-readable storage memory devices comprising processor-executable instructions which, responsive to execution by the at least one processor, enable the system to perform a method of processing encoded data bits at a receiver, the encoded data bits transmitted from a transmitter to the receiver over a lossy communication channel established over a network, the method comprising:
  - receiving the encoded data bits over the lossy communication channel, the encoded data bits contained in packets, the encoded data bits comprising redundant data units, at least some original data of the encoded data in the packets being lost packets during transmission over the lossy communication channel;
  - receiving transmitter information associated with the transmitter that generated the encoded data bits, the transmitter information comprising at least one of:
    - a source encoder name associated with an encoder used to generate the encoded data bits,
    - a source encoder mode associated with the encoder used to generate the encoded data bits;
  - decoding the encoded data bits at an error correction decoder;
  - recovering at least some of the lost packets at the error correction decoder based, at least in part, on at least one of the redundant data units and at least one other packet;
  - determining at least one lost packet is unrecoverable by the error correction decoder due to the error correction decoder finding a plurality of candidate bit values for at least one data bit in the at least one lost packet;
  - analyzing the plurality of candidate bit values effective to exclude at least one of the candidate bit values for the at least one unrecoverable data bit based, at least in part, on using the transmitter information to identify a bit value or a sequence of bit values of the plurality of candidate bit values as invalid; and
  - resolving the at least one unrecoverable data bit of the at least one lost packet based on said analysis.

* * * * *